United States Patent [19]
Pio et al.

[11] Patent Number: 6,144,588
[45] Date of Patent: *Nov. 7, 2000

[54] MONOLITHICALLY INTEGRATED GENERATOR OF A PLURALITY OF VOLTAGE VALUES

[75] Inventors: Federico Pio, Milan; Bruno Vajana, Bergamo; Paola Paruzzi, Robbiate, all of Italy

[73] Assignee: SGS-Thomson Microelectronics, S.r.l., Agrate Biranza, Italy

[ * ] Notice: This patent issued on a continued prosecution application filed under 37 CFR 1.53(d), and is subject to the twenty year patent term provisions of 35 U.S.C. 154(a)(2).

[21] Appl. No.: 09/150,802

[22] Filed: Sep. 10, 1998

Related U.S. Application Data

[63] Continuation of application No. 08/563,758, Nov. 29, 1995, abandoned.

[30] Foreign Application Priority Data

Nov. 30, 1994 [EP] European Pat. Off. .............. 94830554

[51] Int. Cl.[7] ...................................................... G11C 7/00
[52] U.S. Cl. ...................................... 365/189.09; 365/226
[58] Field of Search ............................... 365/189.09, 226, 365/185.18, 185.19, 185.03; 327/100, 530, 540, 541

[56] References Cited

U.S. PATENT DOCUMENTS

| | | | |
|---|---|---|---|
| 4,340,824 | 7/1982 | Shaw | 307/115 |
| 4,532,432 | 7/1985 | Mizuno et al. | 307/10 |
| 5,153,452 | 10/1992 | Iwamura et al. . | |
| 5,218,571 | 6/1993 | Norris . | |
| 5,327,072 | 7/1994 | Savignac | 323/313 |
| 5,361,001 | 11/1994 | Stolfa | 327/530 |

FOREIGN PATENT DOCUMENTS

| | | |
|---|---|---|
| 0086360 | 8/1983 | European Pat. Off. . |
| 0640974 | 3/1991 | European Pat. Off. . |
| 2099617 | 12/1982 | United Kingdom . |

OTHER PUBLICATIONS

Patent Abstracts of Japan, vol. 7, No. 220 (P–226) [1365], Sep. 30, 1983 "Prom Data Writing Circuit", Shimamura, 58–111189.

Patent Abstracts of Japan, vol. 7 No. 57 (P–181) [1202], Mar. 9, 1983 "Semiconductor Storage Device", Nishiuchi, 57–203286.

Patent Abstracts of Japan, vol. 15, No. 148 (E–1056) Apr. 15, 1991, "High Voltage Generating Circuit", Toshiaki, JP 3022860.

*Primary Examiner*—A. Zarabian
*Attorney, Agent, or Firm*—Jenkens & Gilchrist; Theodore E. Galanthay

[57] ABSTRACT

A generator for generating a plurality of predetermined voltage values for non-volatile memories. The generator includes an input node, a plurality of circuit branches, and an output terminal. The input node has a reference voltage and is connected to at least one of the circuit branches. Each of the circuit branches has at least one active element to selectively and independently turn on and turn off each of the circuit branches by a voltage applied to a control terminal of each active element. The output terminal connects to at least one of the circuit branches and supplies a voltage level based on the reference voltage and a voltage drop across each activated circuit branch. Alternatively, the output terminal supplies a floating voltage level in the event of one or more of the active elements along each of the circuit branches being turned off so as to isolate the input node from the output terminal.

35 Claims, 5 Drawing Sheets

MONOLITHICALLY INTEGRATED GENERATOR OF A PLURALITY OF VOLTAGE VALUES

This application is a continuation of application Ser. No. 08/563,758 filed Nov. 29, 1995 now abandoned.

CROSS-REFERENCE TO RELATED APPLICATION

This application claims priority from EPC App'n 94830554.5, filed Nov. 30, 1994, which is hereby incorporated by reference.

BACKGROUND AND SUMMARY OF THE INVENTION

The present invention relates to a monolithically integrable generator of a plurality of predetermined voltage values, especially for multilevel memories.

The present invention also relates to a method for generating a plurality of predetermined voltage values in a monolithically integrated electronic circuit.

Specifically the present invention concerns a programming voltage generator for non-volatile memories and more specifically for EEPROM memories with multiple logic levels.

The present invention also concerns a memory circuit incorporating a memory matrix and programming voltage generators of the above type. The following description is given with reference to this field of application with the main purpose of simplifying discussion thereof.

As is well known, in integrated circuits it is often necessary to have available a plurality of predetermined and discrete voltage values, readily distinguishable and accurately controllable. The voltage value is supplied to a user circuit and serves either as reference or as power supply for part of the circuit itself.

In particular in the present description reference is made to non-volatile memory circuits and specifically to multi-level memories requiring different programming voltages.

As known, multilevel memories are of great interest in the new technologies because they allow reduction of the size of the memory matrix. Indeed, in a multilevel memory it is possible to store a certain number of different logical states (more than two) in each individual memory cell. It is worth recalling that a memory cell is formed by means of a floating-gate MOS transistor and for each memory cell the logical states are distinct from the amount of charge stored in the floating gate. Standard non-multilevel non-volatile memories are programmed in two logical states which allow storage of one bit per cell. In the case of multilevel memories it is possible to distinguish more than two stored charge states and correspondingly it is also possible to program multiple logical states in each cell. For example where it is possible to distinguish four or sixteen states in a cell, each memory cell stores two or four bits in conformity with binary coding.

The logical states or levels correspond electrically to different threshold voltage values of the cell and therefore to different programming voltages which must be applied to terminals of a cell or to terminals common to a series (row/column) of cells. The terminals to which the programming voltages for a cell are applied are the control gate terminals and/or drain terminals, while for a row and/or column of cells they are respectively the "word line" and/or "bit line" terminals. To obtain multilevel programming it is necessary in any case to have predetermined voltage values available, distinguishable with sufficient accuracy. For a level to be distinct from the contiguous ones its range of variation must obviously be less than the separation between two contiguous levels. In this manner overlapping of the levels is avoided which would cause a resulting incorrect multilevel programming.

Generation of the voltage values necessary for programming a cell is dependent on the type of memory cell. In any case in any memory circuits at least one supply voltage Vcc is available, derived from an external line, and a programming voltage Vpp for programming the cells. The procedures for application of the programming voltage to the cell terminals are different. In the case of EPROM memories the programming voltage is generated externally. In the case of EEPROM memories, which are the preferred subject matter of the present patent proposal, the programming voltage Vpp is usually generated internally in the integrated circuit. The voltage is generated by means of a so-called voltage pump circuit. The power supply voltage Vcc, typically 5V, is applied to the input of the voltage pump circuit to produce at its output a higher voltage Vpp, typically variable in a range 5V to 20V. For multilevel EEPROM memories it is also necessary to have different voltage values Vppn actually applied to the cell for its programming. Incidentally, in the different applications, programming can require either positive or negative voltage values.

For generating the predetermined voltage values there have been already proposed different circuit solutions. The programming method for a multilevel EEPROM cell at the desired value is specifically dependent on the type of the cell. With reference to EEPROM memory cells of the FLOTOX type, a programming method is described e.g. in European patent application no. 93830172.8, filed Apr. 22, 1993 by this applicant. In this application, a circuit structure is described in which a capacitor, interposed between a drain node of a cell (i.e. the corresponding bit line) and a bit line voltage generator, acts as a programming voltage generator. By keeping the control gate of the cell polarized at a pre-set voltage value, there is charge injection in the floating gate by tunnel effect until formation of the channel in the cell and then discharge of the capacitor to ground with immediate interruption of programming. In this case the control gate voltage must be regulated with great accuracy.

A programming algorithm divided in several steps, preferably with a rough adjustment and a subsequent fine adjustment which is interrupted when the chosen level is reached, is illustrated for the same type of cell in U.S. Pat. No. 4,890,259. A similar regulation method in successive steps, for EEPROM memory cells with two polysilicon levels, is proposed in European patent application no. 93830061.3, filed Feb. 19, 1993 by this applicant. In this specific case a voltage at a node which absorbs current, during the writing step, is regulated with great accuracy.

Generation of voltage values Vppn, in conformity with the known techniques above mentioned, has the drawback that rather complex and sophisticated circuits have to be used to ensure adequate precision in distinguishing the logical levels to be stored. This entails technological efforts for realizing the generator, and requires manufacture of circuit elements by means of specific techniques different from those for forming the memory matrix.

In addition, voltage generators in accordance with the known art require waste of a large part of integrated circuit area because of the presence of a considerable number of components. Therefore the cost of the device containing a memory matrix of a given capacity increases.

The technical problem underlying the present invention is to conceive a monolithically integrable generator for the generation of a plurality of predetermined and discrete voltage values, whose circuit structure would be simple and easy to provide. In this manner it would be possible to lower the production costs of the device containing the generator. At the same time the generator which is the subject matter of the present invention must have structural and functional characteristics allowing good adjustment of the voltage levels generated thereby. A particular purpose is to make available a generator of a plurality of voltage levels for programming non-volatile memory cells. Preferably such a generator must be integrable in a memory circuit in a limited space of the semiconductor chip, using fabrication technologies not different from those used for the memory cells themselves.

The technical problem underlying the present invention is to provide a generator of predetermined and discrete voltage values by employing active elements exhibiting a voltage drop accurately predeterminable from their construction parameters. Each of the predetermined voltage values is a predetermined combination of the voltage drops obtained at the generator output from a certain number of these active elements.

A voltage generator in accordance with the present invention consists of different circuit branches, each of them comprising at least one of these active semiconductor elements. Each branch exhibits a pre-set voltage drop which, as already mentioned, can be regulated accurately. The branches are connected together and selectively activated to generate the predetermined voltage values as a combination of the individual voltage drops.

In accordance with a preferred embodiment MOS transistors are used as active elements, taking advantage of the fact that they are already present in the technology, especially in memory circuits. The latter is a preferred application for a generator in accordance with the present invention. It is possible to use simple MOS transistors because a diode-connected MOS transistor transfers to its own source a predeterminable voltage, equal to the voltage applied to the drain minus its threshold voltage, increased as a result of the well-known body effect.

On the basis of this solution idea the technical problem is solved by a generator of the type set forth above and defined in the characterizing part of claims 1 and following.

The technical problem is also solved by a method for generating a plurality of predetermined voltage values internally to a monolithically integrated electronic circuit, as defined in the characterizing part of claim 23.

The characteristics and advantages of the generator in accordance with the present invention are set forth in the description of an embodiment thereof given below by way of non-limiting example with reference to the annexed drawings.

DETAILED DESCRIPTION OF THE PREFERRED EMBODIMENTS

Figure 1A:
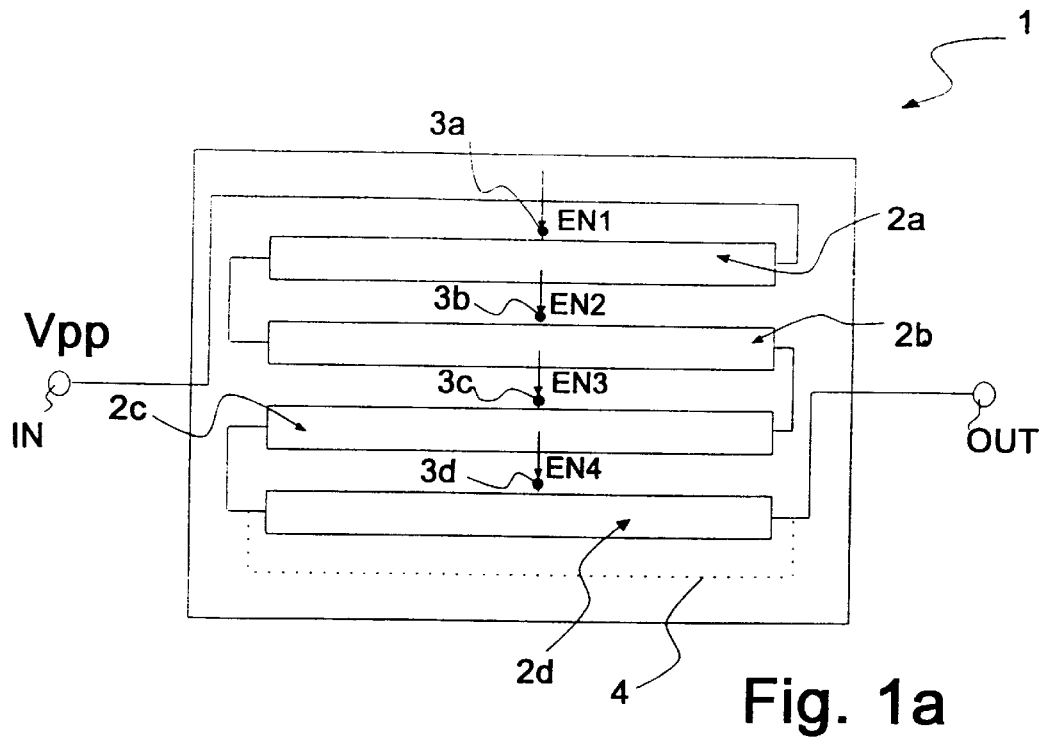
FIGS. 1a and 1b show respective block diagrams of a voltage generator provided in accordance with the present invention.
Figure 1B:
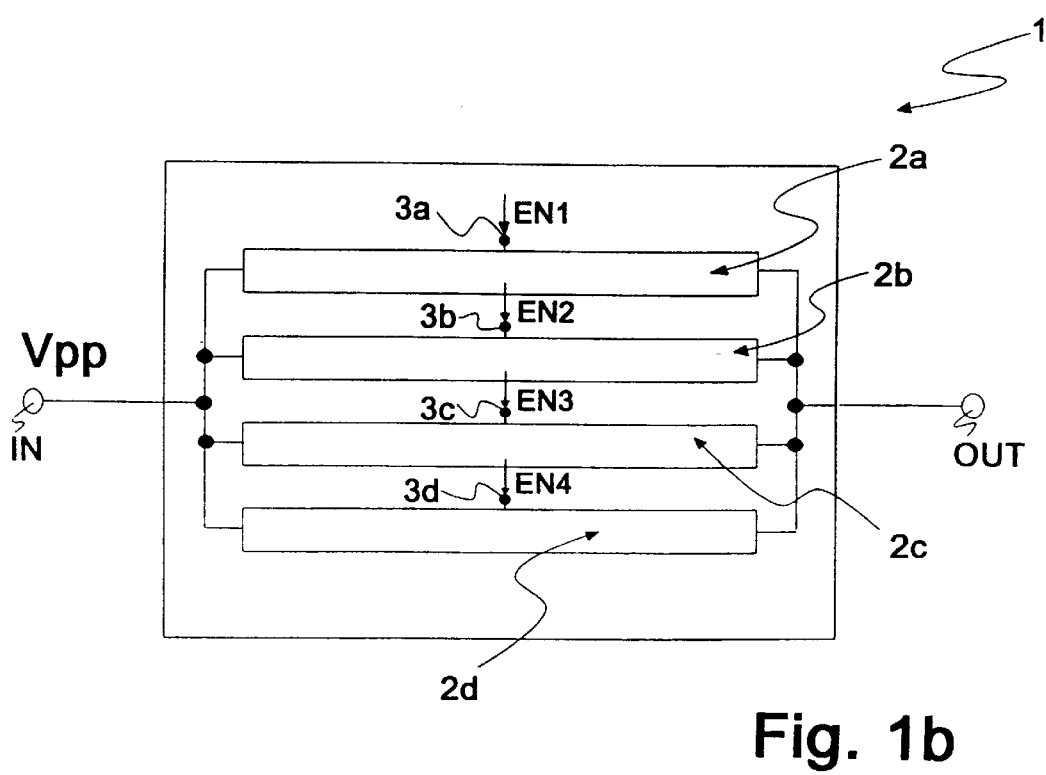

With reference to FIGS. 1a and 1b, reference number 1 indicates as a whole and schematically a voltage generator provided in accordance with the present invention. The generator 1 includes an input node IN and an output terminal OUT. At the input node is kept a constant voltage Vpp, e.g. a programming voltage for a memory cell matrix. At the node OUT the generator produces a plurality of N predetermined and discrete voltage values Vppn.

For generating said voltage values Vppn, the generator in accordance with the present invention comprises a plurality of M circuit branches, labelled as 2a, 2b, 2c and 2d. The value M can optionally be equal to N. In FIGS. 1a and 1b are shown four branches by way of example, in accordance with a preferred embodiment of the present invention. Preferably the number M of the branches is on the order of a few units or tens. Each of the branches incorporates its own turn-on control terminal (3a, 3b, 3c and 3d in FIGS. 1a and 1b) which allows activation of the same branch. Each of these branches is characterized by a predetermined voltage drop Vm at its ends. The amounts of the voltage drops are preferably, but not necessarily, different from each other. Said branches are connected together in such a way that at least one of them is fed to the input node and at least one of them is associated with the output terminal. The connection among the different branches can be provided in accordance with different combinations. In FIGS. 1a and 1b are specifically illustrated two different configurations. In FIG. 1a the branches are all together connected in series between the input node IN and the output terminal OUT. In FIG. 1b the connection of the branches is in parallel between the input node IN and the output terminal OUT. In addition to the configurations indicated in the FIGS. 1a and 1b, mixed combinations are also possible.

Operation of the generator of FIGS. 1a and 1b is as follows. A control signal, generated outside the circuit, is applied to at least one of the turn-on control terminals 3a, 3b, 3c and 3d. The control signal is shown in FIGS. 1a and 1b with the arrows EN1, EN2, EN3 and EN4. This signal can be generated for example by a logical circuit, not indicated in the figures because it is conventional. The function of the control signal is to enable the corresponding branch to conduct. When a branch is selected, a voltage drop Vm is present at its ends. Said voltage drop is produced, for each of the branches, by at least one active semiconductor element incorporated in the branch and illustrated in FIGS. 2, 3, 4 and 5. The control signal turns on a predetermined subset of the entire plurality of branches so that there is a continuous conduction path between the input node IN and the output terminal OUT. In this manner the voltage drop at the output terminal, compared with the voltage at the input node, is produced by combination of the voltage drops of the turned on branches included in the conduction path.

In practice, when the connection between the branches is in series as in FIG. 1a, each branch is enabled to conduct or short-circuited. This behavior is illustrated in the figure for a specific branch, e.g. branch 2d, by means of the dash line 4. Selection of the branches, again in this case, is done directly for all the branches which must be turned on or for a part thereof, and it is also possible to turn on a single branch permitting utilisation of the voltage drop on the other branches connected thereto in cascade. In case of parallel connection as shown in FIG. 1b, each branch is functionally activated or disconnected. The control signal acts selectively on the only branch which must be turned on.

Figure 2:
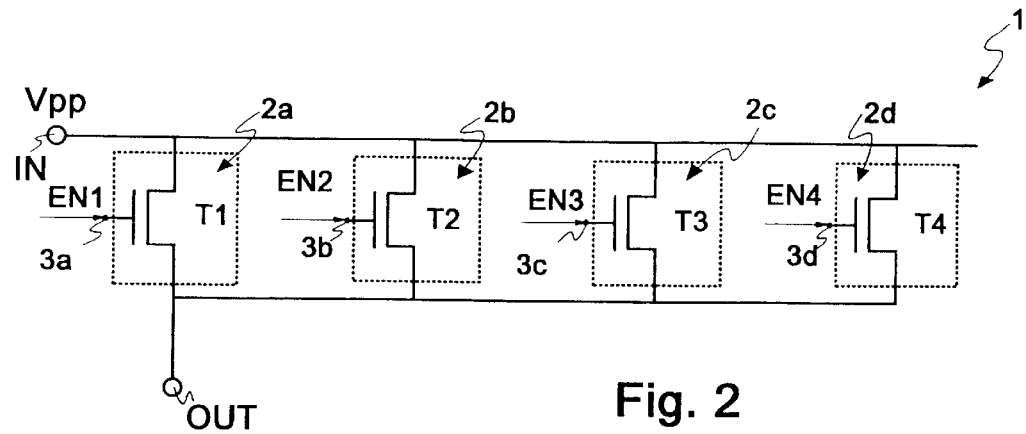
FIG. 2 shows a first embodiment of a generator in accordance with the present invention.

Now with particular reference to a preferred embodiment shown in FIG. 2, the structure of the generator in accordance with the present invention is described in greater detail. In said FIG. are shown the same reference numbers and symbols as in FIGS. 1a and 1b for elements having the same structure and operation as the parts indicated schematically in those figures.

The generator illustrated in FIG. 2 comprises circuit branches 2a, 2b, 2c and 2d connected in parallel between the input node IN and the output terminal OUT, similarly to the schematic representation of FIG. 1b. The number M of branches, in this specific case four, is equal to the number N of predetermined voltage values generated by the present circuit (M=N). Each branch includes a single MOS transistor, T1, T2, T3 and T4 respectively. Each of these transistors Tn comprises its own control terminal (gate terminals) 3a, 3b, 3c and 3d to allow to turn on the transistor itself and to activate the corresponding branch. The transistors Tn also include a drain terminal connected to the input node IN of the generator and a source terminal connected to the output terminal OUT. In addition to performing the function of branch selection elements, the transistors constitute in this preferred embodiment the active elements across which is present the voltage drop Vn, characteristic of each branch as mentioned above. Said voltage drop for each transistor is determined by the threshold voltage value of the transistor, as will be better explained below. In addition, in this preferred embodiment the transistors necessarily have different voltage drops, so that can be generated at the output terminal of the generator a plurality of distinct voltage values.

During operation of the circuit the control signal (ENn) is applied to only one of the gate terminals of the transistors Tn so as to turn on only that transistor. Specifically, the control signal ENn imposes at the control terminal of the chosen transistor a voltage equal to the voltage Vpp present at the input node of the generator. The transistor is in a "diode type" configuration, with gate and drain terminals at the same voltage. In this configuration there is a pre-set voltage drop between drain and source, equal to the threshold voltage Vth(Tn) of the MOS transistor and dependent on the chosen transistor. In this manner at the output terminal OUT is generated a predetermined voltage Vn, less than the input voltage Vpp.

The generator in accordance with the present invention in its preferred embodiment therefore generates at the output terminal OUT a plurality of predetermined and discrete voltage values equal to Vout=Vin−Vth(Tn), where Vout is the voltage at the output terminal OUT, Vin is the voltage at the input node IN, i.e. Vpp, and Vth(Tn) is the threshold voltage of the transistor Tn when the branch n is selected.

As mentioned above, in this embodiment it is necessary that the transistors Tn have distinct threshold voltages Vth (Tn). It should be noted, for integrating in a chip transistors having a predetermined threshold voltage, the semiconductor must be appropriately doped. Specifically, during the steps for forming the transistor, the surface of the semiconductor is masked and, subsequently, dopant elements are implanted on the uncovered zones. This necessitates having a threshold calibration system available having a certain dose value to be implanted and/or a certain energy. In accordance with the present invention in which the different thresholds are N, it is not however necessary to execute N masking and implanting operations. To minimize the number of masks it is possible to obtain different dopings by means of different combinations of a smaller number of implantations. By way of example, in the specific case illustrated in FIG. 2 in which are necessary four distinct thresholds, the embodiment is especially simple from the technical viewpoint. In this case only two dose implantations, D1 and D2 (e.g. D2=2*D1), and thus only two masks, are needed to obtain all the transistors. In particular, T1 is always masked and therefore is not implanted and Vth(T1)=Vth, natural threshold of the transistor. For the other transistors one proceeds respectively with the following implantations: D1 for the transistor T2 (Vth(T2)=Vth+DVth1), D2 for T3 (Vth(T3)=Vth+DVth2) and D1+D2 for T4 (Vth(T4)=Vth+Dvth1+DVth2). In present applications this type of implantation is already present in the circuit manufacture technology. More specifically, in the preferred embodiment, the transistors T1 are formed by CMOS technology. In a standard CMOS process, e.g. in case of multilevel EEPROM non-volatile memory for forming the memory matrix, two implantations are already provided. Therefore the additional operations for forming the generator in accordance with the present invention constitute a limited complication in comparison with a process of formation of the device without generator.

Specific use of CMOS technology also allows generation at the generator output of both positive and negative voltage values by using n-channel transistors or p-chaniiel transistors respectively, and inverting in the latter case the polarity of all the voltage values.

As an alternative, since the threshold voltage of a MOS transistor depends on the gate oxide thickness, transistors with different thresholds can be achieved by intervening on this parameter, optionally in conjunction with a multiple implantation as described above.

It should be noted that the generator in accordance with the present embodiment of the invention is especially simple and compact in terms of area occupied. The circuit is also easy to be made with no, or minimal technological effort, especially if, as illustrated in FIG. 2, the number of voltage values to be generated is not too high. The embodiment of the present invention in accordance with the diagram of FIG. 2 is especially suitable in the latter case where a limited number of voltage values is desired.

It is also noted that it is possible to regulate with great accuracy the voltage drop across each branch. Both implantation and oxidation process parameters can be readily controlled with a variability (the so-called process spread) very small. The threshold voltage value can be predetermined by the construction parameters (doping and/or gate oxide thickness) and the spread is a known characteristic. On the other hand, stability is ensured by the considerable simplicity of the circuit. An indicative value of the difference in voltage between two contiguous levels obtainable by a generator in accordance with the present invention is around 500 150 mV. Incidentally, it is worth noting that with the present embodiment, the number of levels regulated is not necessarily an exact power of two.

Figure 3:
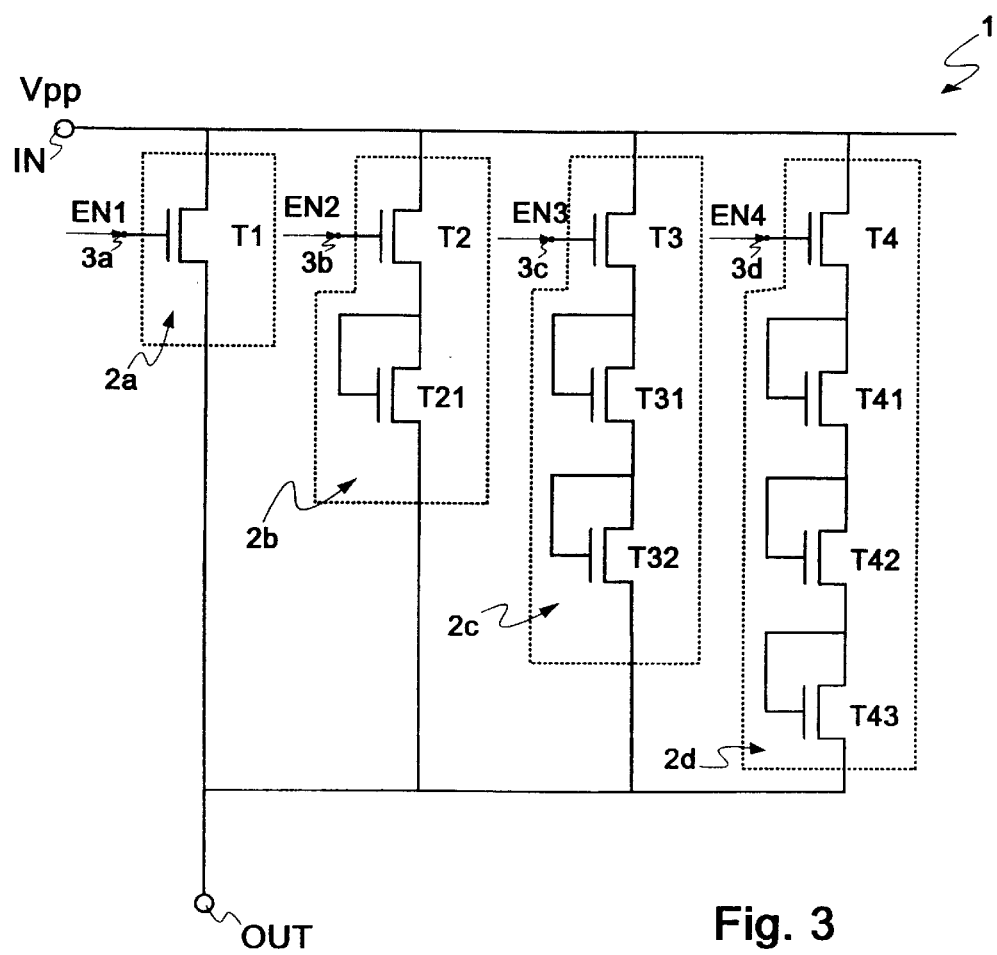
FIGS. 3, 4 and 5 show different embodiments of a generator in accordance with the present invention.
Figure 4:
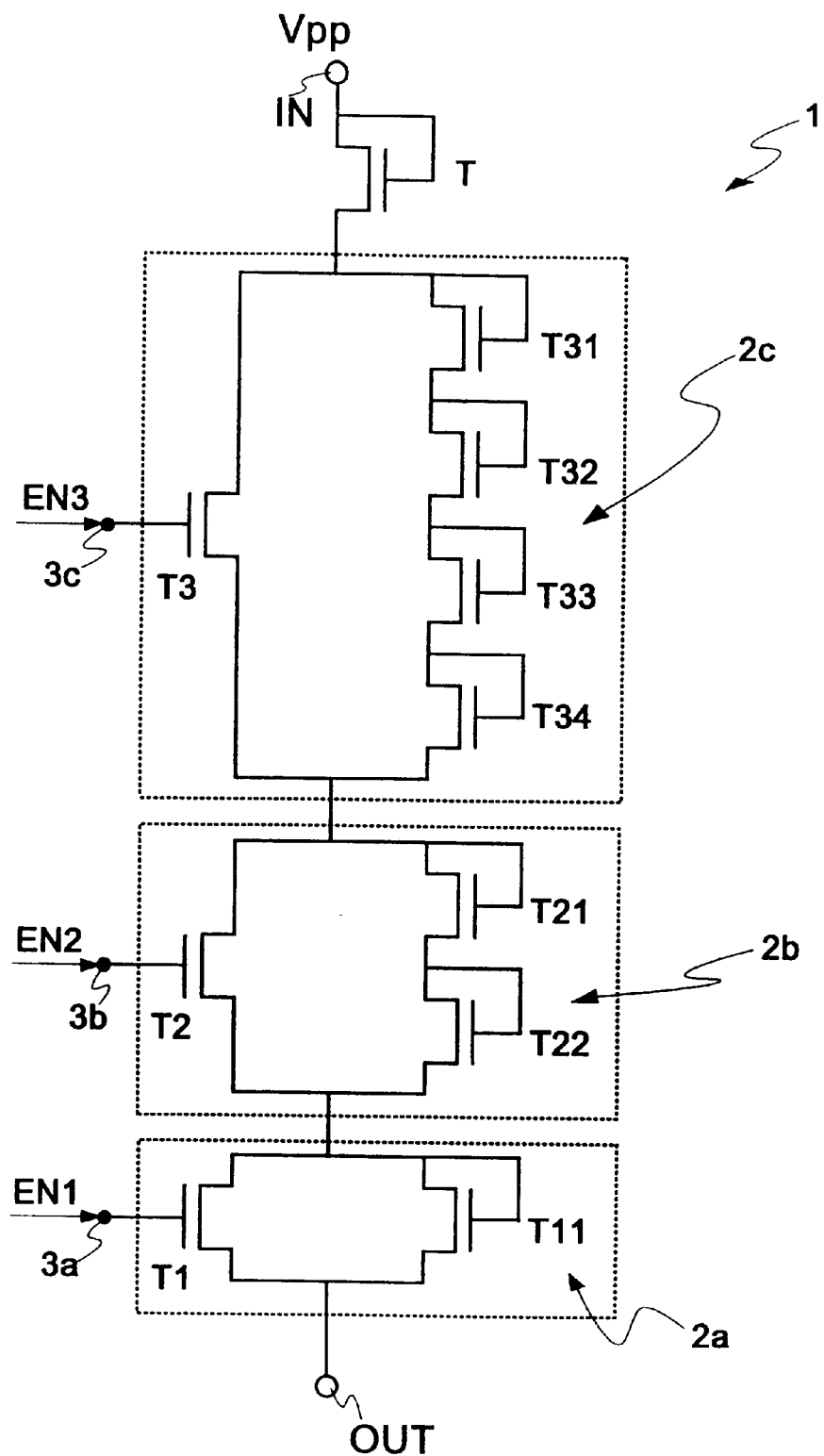
Figure 5:
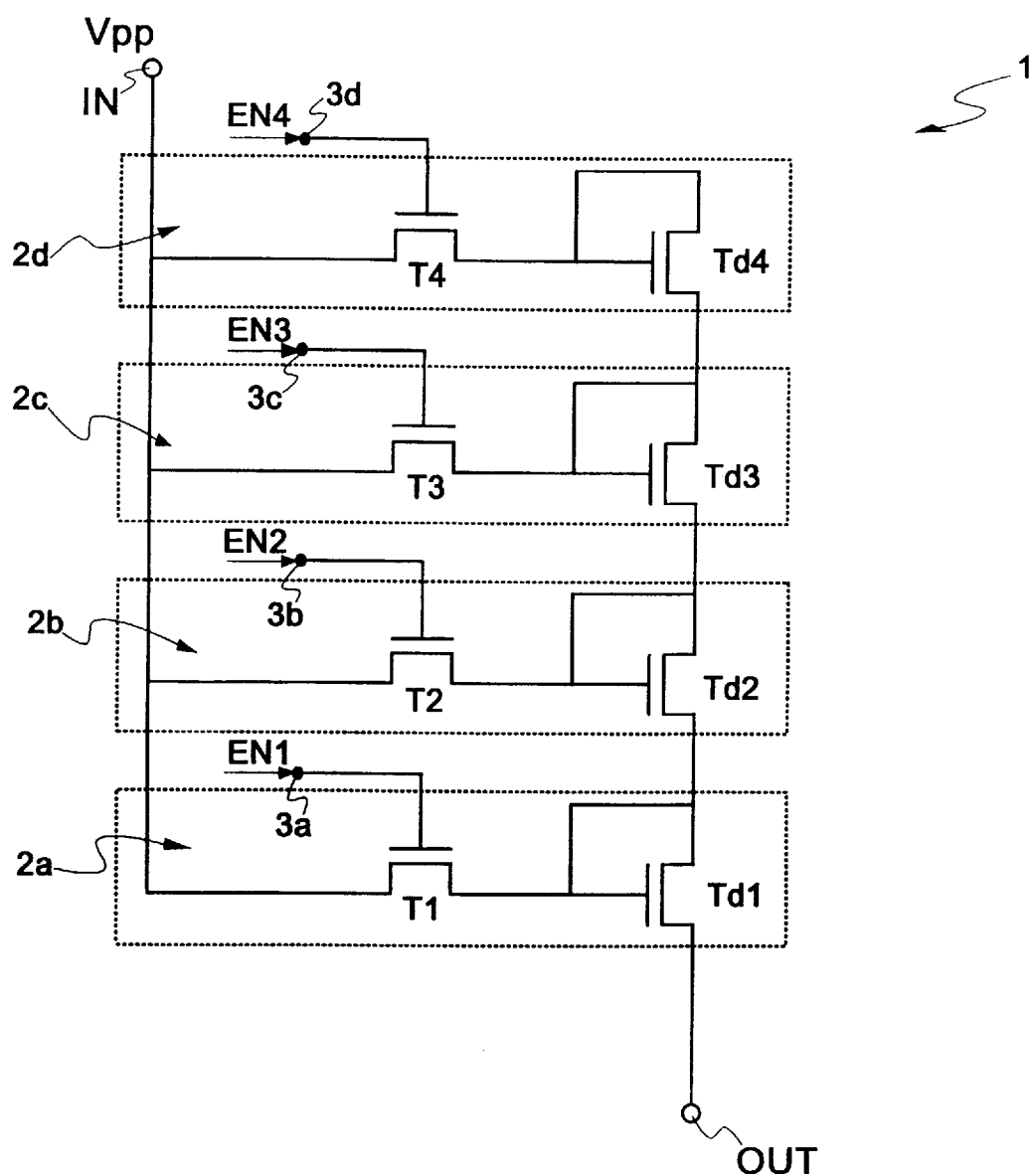

With reference to FIGS. 3, 4, and 5 will be now described further different embodiments of the generator in accordance with the present invention. Details and co-operating parts having the same structure and operation as the above embodiment are given the same reference numbers and symbols.

FIG. 3 shows a generator comprising M circuit branches 2a, 2b, 2c and 2d connected in parallel between the input node IN and the output terminal OUT, similarly to the case illustrated in FIG. 2. For comparison with the example shown in FIG. 2, four of them are shown in this embodiment also. The number M of the branches is equal to the number N of predetermined voltage values which may be generated at the output terminal OUT (M=N). Every n-th circuit branch includes a progressive number n of MOS transistors connected in series. In particular for each branch the n transistors comprise a first transistor (pass transistor) T1, T2, T3 and T4 connected through its own drain terminal to the input node IN and having a gate terminal (turn-on control terminals 3a, 3b, 3c and 3d) for controlling transistor turn-on. The transistors Tn act as selection transistors for turning on the corresponding branch to which they belong. The branches comprise also n−1 transistors Tni, where n=1, . . . N indicates the branch under consideration, i=1, . . . n−1 indicates the position of the transistor in the branch starting from the one nearest the selection transistor. The transistors Tni are diode-connected in series between a source terminal of the corresponding selection transistor Tn and the output terminal OUT. These transistors Tni, because of their diode configuration, as described above for the embodiment of FIG. 2, have the function of generating at their source terminal a certain voltage, equal to the voltage applied to their drain terminal minus the threshold voltage. Said transistors are preferably all equal and have in particular the same threshold. The total voltage drop Vn for each circuit branch therefore increases progressively.

Again in this case, the operation takes place turning on by means of the control signal (ENn) only one of the transistors Tn. Specifically, the gate terminal of the chosen transistor Tn is polarized at a voltage less than or equal to the voltage present at the drain, i.e. at the input voltage Vin=Vpp. Assuming for example that the third branch is activated by polarizing the gate of T3 at a value Von, at the output OUT of the generator is obtained a voltage Vout=Von−Vth(T3)−Vth−Vth, where Vout is the voltage at the output terminal OUT, Vth(T3) is the threshold voltage of the transistor T3, and Vth is the threshold voltage, affected by the body effect, of the two diode-connected transistors.

Furthermore, if a current absorption from the output terminal OUT is expected, it is necessary to remember that across the transistors is also present a voltage drop between drain and source depending on the current (point of work). To minimize this problem there is provided at the output an additional transistor, having its gate connected to the output terminal and drain held at the voltage value Vpp. In this first embodiment variation of the present invention the transistors can and preferably do have the same threshold voltage. Manufacturing of the generator can therefore be simplified from the technological viewpoint concerning the process steps. On the other hand, the embodiment described, while being equally simple from the structural viewpoint, is less compact than that illustrated in FIG. 2.

Another embodiment variation of the generator of the present invention, which allows reduction of the total number of transistors, is illustrated in FIG. 4. The generator comprises M circuit branches 2a, 2b and 2c connected in series between the input node IN and the output terminal OUT, analogously to the diagrammatic representation of FIG. 1a. Each circuit branch 2a, 2b and 2c comprises the parallel of a selection transistor T1, T2 and T3 (shunt transistor) and a series of diode-connected transistors Tmi, where m indicates the branch and i defines the transistor in the branch. The selection transistors have respective turn on control terminals 3a, 3b and 3c for the corresponding branch thereto the control signal is applied. The number of transistors Tmi for each branch m depends on the branch. In particular, if the branch having m=1 is considered the one nearest the output terminal OUT, as shown in FIG. 4, the number of transistors Tmi is equal to a power of two, and specifically 2 m−1. Indeed in the embodiment illustrated including three circuit branches, the first branch comprises a single transistor, the second branch two and the third four. Said transistors Tmi have preferably the same threshold. In the embodiment of FIG. 4 a diode-connected transistor T, which may be useful for eliminating undesired voltage drops (as discussed below), is connected in series to the branches 2a, 2b and 2c and to the input node.

In accordance with the present embodiment, the control signal ENm can be applied to one or more control terminals 3a, 3b and/or 3c. When the control signal is applied to a gate terminal of a transistor Tm, specifically polarizing the terminal at the input voltage Vpp, the transistor is switched in conduction, short-circuiting the corresponding branch; there is therefore no voltage drop. If, on the contrary, the shunt transistor Tm is left off, there will be a voltage drop generated across that branch by the diode-connected transistors Tmi. The total voltage drop, which can be measured at the output terminal OUT, compared with the voltage Vpp, is the sum of the voltage drops through the branches not short-circuited. For example the lower value of total voltage drop is due only to the transistor T and is obtained by short-circuiting all branches. Subsequently by short-circuiting the second and third branches there is a voltage drop only across one transistor (T11). By short-circuiting the first and third branches the voltage drop is produced by two transistors (T21 and T22). The voltage values can therefore be generated by using a control signal obtained from a circuit which follows a binary logic. Anyway it is possible to have circuit branches with a number of diode-configured transistors not exactly equal to a power of two. In this case allowance would have to be made for the correspondence between binary coding and real voltage drops.

This second implementation variation allows a reduction in the number of control signals if compared with the example of FIG. 3. Furthermore, the number of circuit branches is reduced from M to LOG(M)/LOG2, and the total number of transistors is reduced with a resulting gain in terms of chip area. In fact the total number of transistors increases linearly with the number M of the levels (M−1) instead of quadratically (N*(N−1)/2).

FIG. 5 shows a third embodiment variation of the generator in accordance with the present invention. The generator comprises a plurality N of circuit branches 2a, 2b, 2c and 2d equal to the number of distinct voltage values which can be generated. Each of the branches includes a selection transistor T1, T2, T3 and T4, and a diode-connected transistor Td1, Td2, Td3 and Td4 generating a predetermined voltage drop. In FIG. 5 said voltage drops are preferably equal. In each branch the two transistors are connected in such a manner that the selection transistor drain is connected to the input node, its gate represents the control terminal of the branch, and its source is connected to a gate node of the diode-connected transistor. The sources and drains of the diode-connected transistors of two contiguous branches are connected together, as shown in said figure. For each branch n, if V is the voltage at the drain of the transistor Tdn, the voltage at its source is decreased by its threshold, i.e. V−Vth(Tdn).

When the selection transistor Tn is off, the voltage V is that transferred from the source of the transistor Td(n+1). If the selection transistor Tn is turned on by means of the control signal (ENn), the voltage V is that at the gate node of the transistor Tdn as transferred to it from the source node of the selection transistor, i.e. V=Vpp−Vth(Tn).

To generate the n-th voltage value, the control signal must enable to conduction only the n-th selection transistor and leave the others off. For example, turning on the transistor T3 leads to generating a voltage Vout=Vpp−Vth(T3)−Vth(Td3)−Vth(Td2)−Vth(Td1) at the output node OUT.

It is worth noting that the total number of transistors contained in this third embodiment variation is still on the order of the previous case (2*N). This embodiment is especially suitable when it is not desirable to use a binary coding for programming the branches to be activated, otherwise than in the above second embodiment variation.

To produce the voltage drops in the various embodiments of the present invention it should be recalled that the threshold of a transistor is not constant but increases with increasing of the voltage applied thereto, because of the well known body effect. Therefore the separation between the voltage values obtainable at the output is not constant. However this does not constitute a problem in an application in which it is necessary to be able to discriminate only between two contiguous levels. In some applications this phenomenon could be advantageous. If the difference in voltage between successive levels must be a constant quantity, it would be possible to have recourse to a differentiation of the transistors on each of the branches.

It is also noted that the voltage Vpp applied to the input node IN in some applications can take on different values, e.g. values obtainable from different stages of a voltage booster circuit.

Figure 6:
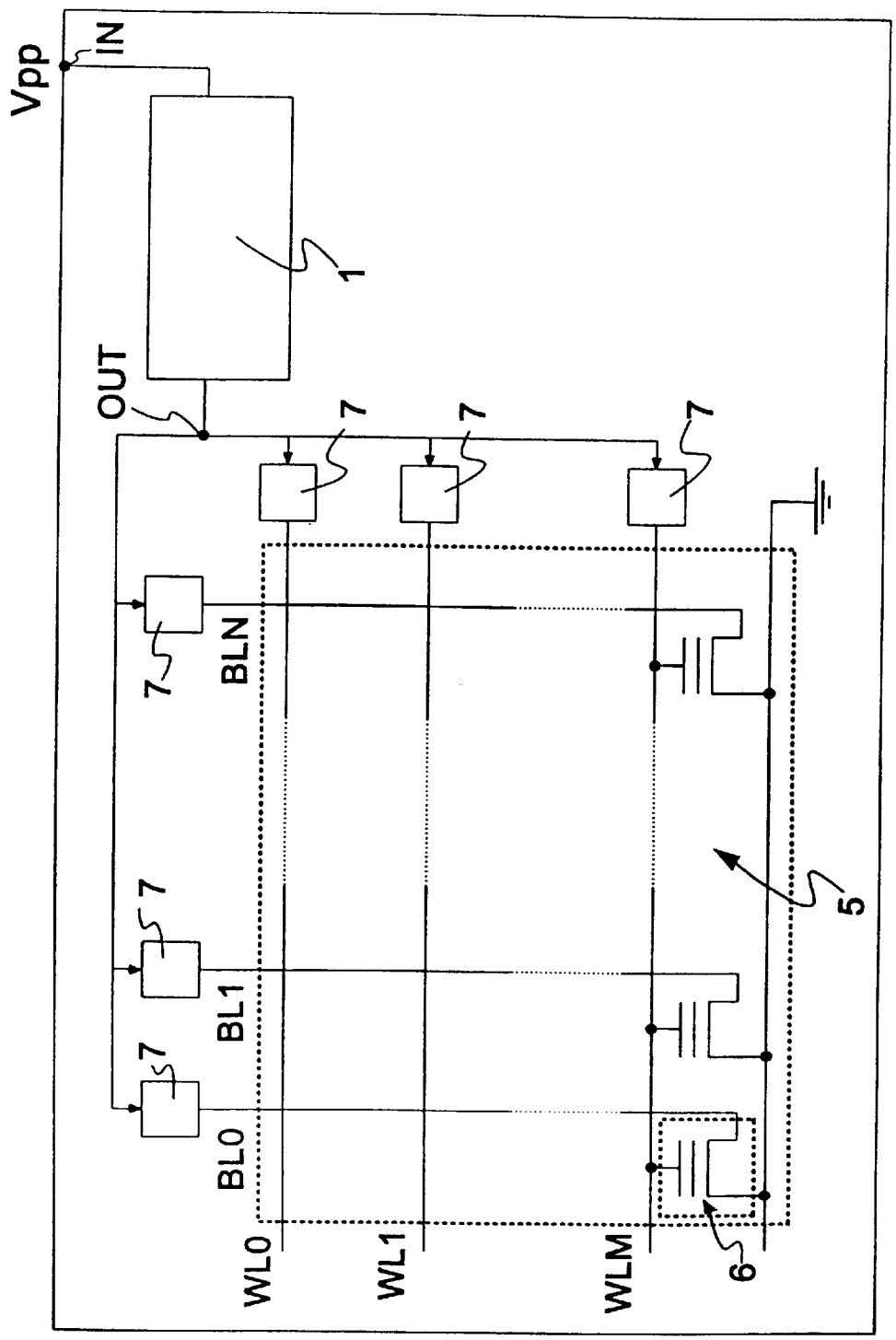
FIG. 6 shows schematically an example of application to a memory circuit of the generator in accordance with the present invention.

FIG. 6 shows a preferred example of application for the generator of the present invention to a memory circuit. In the figure, reference number 5 indicates a memory cell matrix, especially a multilevel EEPROM memory. The matrix 5 is conventional, and organized in M+1 rows and N+1 columns defined by conductive metallization lines called respectively word lines (WLO, . . . WLM) and bit lines (BLO, . . . BLN). At each intersection of a row and a column is placed a memory cell 6, formed by means of a floating-gate MOS transistor having its drain connected to the corresponding bit line (BLO) and its control gate to the corresponding word line (WLM). For multilevel programming of each cell (write or erase) to its gate and/or drain terminals there must be applied predetermined voltage values. Therefore said terminals are connected alternately to a generator 1 by means of selection circuitry 7, e.g. switches, which permit selection, or rather addressing of the chosen cell. The generator 1 is provided in accordance with the present invention, and as described above. The input node of the generator in this application is connected to the voltage Vpp, the maximum programming voltage generated for example by a voltage pump circuit. Predetermined voltage values, lower in absolute value than the voltage Vpp, are generated at the output terminal OUT of the generator in the manner set forth above. The memory cells are programmed by conventional methods.

The generator in accordance with the present invention thus permits generation of a plurality of predetermined and discrete voltage values by employing active elements exhibiting a voltage drop which can be predetermined by the construction parameters. Preferably has been described the case in which diode-connected MOS transistors are used as active elements.

Furthermore, the turning on each branch, which in the embodiments described is achieved by means of a MOS transistor, could take place by means of any switch.

Of course modifications and variations can be made to the generator described above by way of non-limiting example all however falling within the protective scope of the following claims.

MODIFICATIONS AND VARIATIONS

As will be recognized by those skilled in the art, the innovative concepts described in the present application can be modified and varied over a tremendous range of applications, and accordingly the scope of patented subject matter is not limited by any of the specific exemplary teachings given. For example, as will be obvious to those of ordinary skill in the art, other circuit elements can be added to, or substituted into, the specific circuit topologies shown.

What is claimed is:

1. A voltage generator in a semiconductor memory device comprising:
an input node having a reference voltage;
a plurality of circuit branches, at least one circuit branch connected to said input node, each of said circuit branches having at least one active element along said circuit branch to selectively and independently turn on and turn off said circuit branch by a voltage applied to a control terminal of said at least one active element; and
an output terminal connected to at least one of said each of said circuit branches, said output terminal for supplying a voltage level based on said reference voltage and a voltage drop across activated ones of said circuit branches and supplying a floating voltage level in the event one or more of said at least one active element along each of said circuit branches is turned offso as to isolate said input node from said output terminal, wherein said output terminal of said generator is further electrically connected to at least one terminal of at least one memory element for selectively providing a plurality of voltage levels to be stored in memory elements within said semiconductor memory device.

2. The generator according to claim 1, wherein said generator is monolithically integrable.

3. The generator according to claim 1, wherein said generator selectively outputs predetermined voltage values.

4. The generator a according to claim 1, wherein said input node is held at a substantially constant voltage.

5. The generator according to claim 1, wherein said at least one active element is a transistor.

6. The generator according to claim 5, wherein said transistor is a MOS transistor.

7. The generator according to claim 5, wherein for each branch the corresponding voltage drop is present across at least one diode-connected MOS transistor.

8. The generator according to claim 5, wherein said at least one active element includes a gate terminal for turn on and turn off control.

9. The generator according to claim 1, wherein said at least one active element produces a voltage drop along the corresponding circuit branch.

10. The generator according to claim 1, wherein said circuit branches are connected in parallel between said input node and said output terminal.

11. The generator according to claim 1, wherein said circuit branches each having said at least one active element, said at least one active element having a different voltage drop than active elements on different circuit branches.

12. The generator according to claim 11, wherein each active element is a field effect transistor having a control terminal for selectively activating a corresponding circuit branch, a drain terminal electrically connected to said input node, and a source node electrically connected to said output terminal.

13. The generator according to claim 12, wherein said voltage applied to said control terminal of said field effect transistor has a substantially equal voltage to said reference voltage.

14. The generator according to claim 1, wherein said circuit branches are in parallel, said circuit branches include a progressive number of said active elements connected together in series, one of said progressive number of said active elements having a control node connected to a control terminal for turn on and turn off control.

15. The generator according to claim 14, wherein each of said active elements connected in series exhibits a substantially equal voltage drop.

16. The generator according to claim 1, wherein said circuit branches are connected in series between said input node and said output terminal.

17. The generator according to claim 16, wherein each circuit branch has a voltage drop proportional to the number of diode-connected MOS transistors connected together in series along each circuit branch.

18. The generator according to claim 16, wherein said number of MOS transistors is a power of two and the generation of a predetermined voltage at said output terminal depends on turning on one or more of said plurality of branches in accordance with a control signal formatted in a binary code applied to said control terminals connected to said at least one active element to produce a certain voltage drop between said input node and said output terminal.

19. The generator according to claim 16, said at least one active element connected in parallel with said circuit branches connected in series and having a gate node connected to a respective turn on control terminal of said at least one active element for short-circuiting said active element in parallel to its respective circuit branch.

20. The generator according to claim 1, wherein said at least one active element is a CMOS transistor.

21. A memory circuit comprising:
   a memory cell matrix organized in rows and columns, each of said memory cells having drain and gate terminals connected respectively to bit lines and word lines of said memory cell matrix;
   selection circuitry connected to an end of said bit lines and word lines to select at least one memory cell organized in said rows and columns;
   at least one generator having an output terminal connected to said selection circuitry for applying a voltage to said control gate and/or said drain terminal;
   said at least one generator further comprising:
      an input node having a reference voltage;
      a plurality of circuit branches, at least one circuit branch connected to said input node, each of said circuit branches having at least one active element along said circuit branch to selectively and independently turn on and turn off said circuit branch by a voltage applied to a control terminal of said at least one active element; and
      an output terminal connected to at least one of said each of said circuit branches, said output terminal for supplying a voltage level based on said reference voltage and a voltage drop across activated ones of said circuit branches and a floating voltage level in the event one or more of said at least on one active element along said circuit branches is turned off so as to isolate said input node from said output terminal, wherein said output terminal of said generator selectively provides a plurality of voltage levels to be stored in said memory cells within said memory cell matrix.

22. The memory circuit according to claim 21, wherein said memory cell matrix is of the multilevel EEPROM type.

23. The memory circuit according to claim 21, wherein said generator is monolithically integrable.

24. The memory circuit according to claim 21, wherein said memory circuit is formed by CMOS technology.

25. The memory circuit according to claim 21, wherein said at least one active element is formed by MOS technology.

26. The memory circuit according to claim 21, wherein said voltage drop is present across at least one diode-connected MOS transistor.

27. The memory circuit according to claim 21, wherein said at least one active element is a transistor.

28. The memory circuit according to claim 21, wherein said circuit branches include a selection transistor for turn-on control of the respective circuit branch, having a gate terminal connected to said turn-on control terminal.

29. A method for selectively and independently applying a voltage to a memory circuit by at least one generator connected to said memory circuit comprising the steps of:
   applying a reference voltage to an input node connected to a first generator, said first generator having a plurality of circuit branches, each circuit branch having a transistor along each of said circuit branches having a control gate connected to control terminals to selectively and independently turn on and turn off said each circuit branch;
   applying control voltages selectively and independently to said control terminals of said first generator to turn on and turn off said transistor along each of said circuit branches; and
   driving an output terminal to either said reference voltage less a voltage drop across each of said circuit branches that is selectively and independently turned on or a floating voltage if said each transistor along each of said circuit branches were turned off, wherein said output terminal of said generator selectively provides a plurality of voltage levels to be stored in memory cells within said memory circuit.

30. The method according to claim 29, wherein said generator is monolithically integrable.

31. The method according to claim 29, wherein said memory circuit is of the multilevel EEPROM type.

32. The method according to claim 29, wherein said transistor is formed by CMOS technology.

33. The method according to claim 29, wherein said voltage drop is present across at least one diode-connected MOS transistor.

34. The method according to claim 29, further comprising the steps of:
   applying control voltages to said control terminals of a first generator connected to said memory circuit to selectively and independently turn off each of said circuit branches to drive said output terminal of said first generator to said floating voltage; and
   applying control voltages to said control terminals of a second generator connected to said memory circuit to drive said output terminal of said second generator to said reference voltage less said voltage drop across each of said circuit branches selectively and independently turned on.

35. The method according to claim 29, wherein each of said transistors in said generator has a different threshold voltage.

* * * * *